(12) United States Patent
Violette et al.

(10) Patent No.: US 10,481,507 B2
(45) Date of Patent: Nov. 19, 2019

(54) MEASUREMENT METHOD COMPRISING IN-SITU PRINTING OF APPARATUS MARK AND CORRESPONDING APPARATUS

(71) Applicants: ASML HOLDING N.V., Veldhoven (NL); ASML NETHERLANDS B.V., Veldhoven (NL)

(72) Inventors: Kevin J. Violette, Woodbury, CT (US); Igor Matheus Petronella Aarts, Port Chester, NY (US); Haico Victor Kok, Veldhoven (NL); Eric Brian Catey, Danbury, CT (US)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/328,750

(22) PCT Filed: Aug. 18, 2017

(86) PCT No.: PCT/EP2017/070895
§ 371 (c)(1),
(2) Date: Feb. 27, 2019

(87) PCT Pub. No.: WO2018/046279
PCT Pub. Date: Mar. 15, 2018

(65) Prior Publication Data
US 2019/0196341 A1    Jun. 27, 2019

Related U.S. Application Data

(60) Provisional application No. 62/385,095, filed on Sep. 8, 2016.

(51) Int. Cl.
*G03F 7/20* (2006.01)
*G03F 9/00* (2006.01)

(52) U.S. Cl.
CPC ...... *G03F 7/70683* (2013.01); *G03F 7/70516* (2013.01); *G03F 9/708* (2013.01); *G03F 9/7019* (2013.01)

(58) Field of Classification Search
CPC ............. G03F 7/70633; G03F 7/70775; G03F 7/70683
(Continued)

(56) References Cited

U.S. PATENT DOCUMENTS 6,961,116 B2    11/2005    Den Boef et al.
2004/0169833 A1   9/2004    Tanaka
(Continued)

FOREIGN PATENT DOCUMENTS

| CN | 105005182 | 10/2015 |
|---|---|---|
| TW | 201403267 | 1/2014 |
| TW | 201506551 | 2/2015 |

OTHER PUBLICATIONS

International Search Report and Written Opinion issued in corresponding PCT Patent Application No. PCT/EP2017/070895, dated Dec. 6, 2017.
(Continued)

*Primary Examiner* — Hung Nguyen
(74) *Attorney, Agent, or Firm* — Pillsbury Winthrop Shaw Pittman LLP (57) ABSTRACT

A method, including printing an apparatus mark onto a structure while the structure is at least partly within a lithographic apparatus. The structure may be part of, or is located on, a substrate table, but is separate from a substrate to be held by the apparatus. The method further includes measuring the apparatus mark using a sensor system within the apparatus.

20 Claims, 4 Drawing Sheets

(58) Field of Classification Search
USPC .............................................. 355/52, 53, 67
See application file for complete search history.

(56) References Cited

U.S. PATENT DOCUMENTS

| | | | |
|---|---|---|---|
| 2004/0227925 A1* | 11/2004 | Sato | G03B 27/42 |
| | | | 355/72 |
| 2006/0035159 A1 | 2/2006 | Best et al. | |
| 2006/0266244 A1* | 11/2006 | Kruijt-Stegeman | B41F 1/18 |
| | | | 101/485 |
| 2009/0195768 A1 | 8/2009 | Bijnen et al. | |
| 2010/0097595 A1 | 4/2010 | Sato | |
| 2015/0168852 A1 | 6/2015 | Beerens et al. | |
| 2016/0077445 A1 | 3/2016 | Den Boef et al. | |
| 2016/0124322 A1* | 5/2016 | Oishi | G03F 7/70633 |
| | | | 355/67 |
| 2018/0046413 A1* | 2/2018 | Martin | H04N 1/00411 |

OTHER PUBLICATIONS

Taiwanese Office Action issued in corresponding Taiwanese Patent Application No. 106129646, dated Apr. 18, 2018.

\* cited by examiner

MEASUREMENT METHOD COMPRISING IN-SITU PRINTING OF APPARATUS MARK AND CORRESPONDING APPARATUS

CROSS-REFERENCE TO RELATED APPLICATIONS

This application is the U.S. national phase entry of PCT Patent Application No. PCT/EP2017/070895, which was filed on Aug. 18, 2017, which claims the benefit of priority of U.S. Provisional Patent Application No. 62/385,095, which was filed on Sep. 8, 2016, and which is incorporated herein in its entirety by reference.

FIELD

The present description relates to a measurement system and method. The measurement system may form part of a lithographic apparatus.

BACKGROUND

A lithographic apparatus is a machine configured to apply a desired pattern onto a substrate, usually onto a target portion of the substrate. A lithographic apparatus can be used, for example, in the manufacture of integrated circuits (ICs) and other devices. In that instance, a patterning device (e.g., a mask or a reticle) may be used to generate a circuit pattern to be formed on an individual layer of the IC. In such a case, a patterning device (e.g., a mask) may contain or provide a pattern corresponding to an individual layer of the device ("design layout"), and this pattern can be transferred onto a target portion (e.g. including part of, one, or several dies) on a substrate (e.g., silicon wafer). Transfer of the pattern is typically via imaging onto a layer of radiation-sensitive material ("resist") provided on the substrate, by methods such as irradiating the target portion through the pattern on the patterning device. In general, a single substrate contains a plurality of adjacent target portions to which the pattern is transferred successively by the lithographic apparatus, one target portion at a time. In one type of lithographic apparatuses, the pattern is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic apparatus will have a magnification factor M (generally <1), the speed F at which the substrate is moved will be a factor M times that at which the beam scans the patterning device.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, lithography is a central step in the manufacturing of ICs and other devices, where patterns formed on substrates define functional elements of the devices, such as microprocessors, memory chips etc. Similar lithographic techniques are also used in the formation of flat panel displays, micro-electro mechanical systems (MEMS) and other devices.

In a lithographic process (i.e., a process of developing a device or other structure involving lithographic exposure, which may typically include one or more associated processing steps such as development of resist, etching, etc.), it is desirable frequently to make measurements, e.g., for process control and verification. Various tools for making such measurements are known, including alignment sensor systems to measure alignment between structures, topography measurement systems (focus/leveling systems), scanning electron microscopes, which are often used to measure critical dimension (CD), and/or specialized tools using marks to measure various parameters, such as overlay (i.e., the accuracy of alignment of two layers of a substrate), focus used to expose a pattern, a dose used to expose a pattern, CD, etc.

SUMMARY

In an embodiment, there is provided a method, comprising: printing an apparatus mark onto a structure while at least partly within an apparatus, the structure being separate from a substrate to be held by the apparatus; and measuring the apparatus mark using a sensor system within the apparatus.

In an embodiment, there is provided an apparatus, comprising: a structure; a sensor system configured to measure a mark; and a control system configured to: cause printing of an apparatus mark onto the structure while at least partly within the apparatus, the structure being separate from a substrate to be held by the apparatus, and cause measurement of the apparatus mark using the sensor system within the apparatus.

In an embodiment, there is provided a non-transitory computer program product comprising machine-readable instructions for causing a processor system to cause performance of a method as described herein.

In an embodiment, there is provided a system comprising: a hardware processor system; and a non-transitory computer readable storage medium storing machine-readable instructions, wherein when executed, the machine-readable instructions cause the processor system to cause execution of a method as described herein.

Different aspects and features may be combined together. Features of a given aspect may be combined with one or more other aspects or features. Features and/or advantages of embodiments of the invention, as well as the structure and operation of various embodiments of the invention, are described in detail herein with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying schematic drawings, in which.

DETAILED DESCRIPTION

Figure 1A:
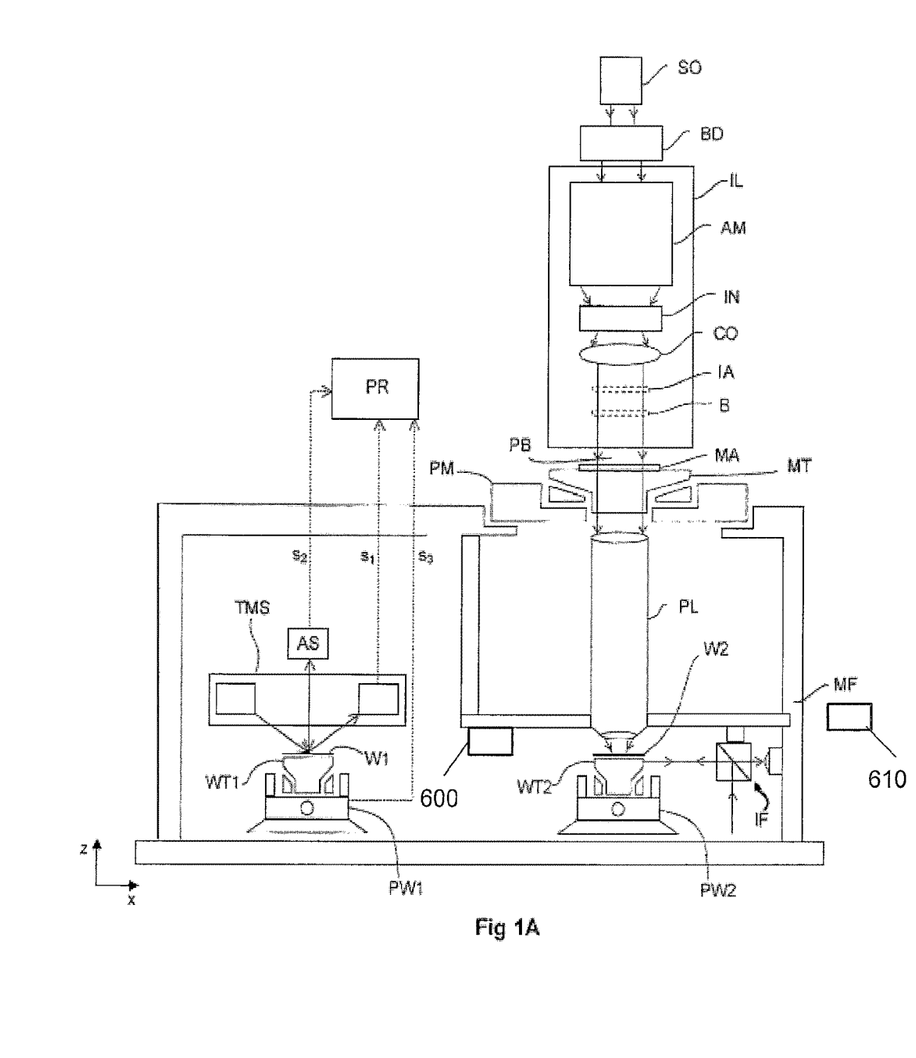
FIG. 1A schematically depicts a lithographic apparatus according to an embodiment.

FIG. 1A schematically depicts a lithographic apparatus according to a particular embodiment. The apparatus comprises:

an illumination system (illuminator) IL configured to condition a beam PB of radiation (e.g. UV radiation or DUV radiation);

a frame MF;

a support structure (e.g. a mask table) MT to support a patterning device (e.g. a mask) MA;

two tables WT1, WT2, at least one configured to hold a substrate (e.g. a resist coated wafer). In this example, each table is configured to hold a substrate W1, W2 respectively; and a projection system (e.g. a refractive projection lens) PL configured to image a pattern imparted to the radiation beam PB by patterning device MA onto a target portion C (e.g. comprising one or more dies) of a substrate W held by at least one of the two tables WT1, WT2.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The term "illumination system" used herein may encompass various types of optical components, including refractive, reflective, and catadioptric optical components for directing, shaping, or controlling the beam of radiation, and such components may also be referred to below, collectively or singularly, as a "lens".

The support structure MT holds the patterning device. It holds the patterning device in a way that depends on the orientation of the patterning device, the design of the lithographic apparatus, and other conditions, such as, for example, whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The lithographic apparatus may also be of a type wherein the substrate is immersed in a liquid having a relatively high refractive index, e.g. water, so as to fill a space between the final element of the projection system and the substrate. Immersion techniques are known in the art for increasing the numerical aperture of projection systems.

The frame MF is a vibration isolated frame that is substantially isolated from external influences such as vibrations. For example, the frame MF may be supported by a base frame (not shown) on the ground via one or more acoustically damping mounts (not shown), so as to isolate the frame MF from vibrations of the base frame. The one or more acoustically damping mounts may be actively controlled to isolate vibrations which are introduced by the base frame and/or by the isolated frame MF itself.

In the dual stage lithographic apparatus depicted in FIG. 1A an alignment system AS and a topography measurement system TMS are provided on the left-hand side and the projection system PL is provided on the right-hand side. The projection system PL, alignment system AS and topography measurement system TMS are connected to the isolated frame MF. The topography measurement system TMS is used to measure the topography of a surface of the substrate W.

In a different embodiment of a dual stage lithographic apparatus, the alignment system AS and/or the topography measurement system TMS is provided at the right-hand side adjacent the projection system PL or between the left-hand side position and the position of the projection system PL or on opposite side of the projection system PL. In an embodiment, having the alignment system AS and/or the topography measurement system TMS at or towards the right-hand side may be advantageous where a first table WT1 is configured to hold a substrate and a second table WT1 is not configured to hold a substrate, but rather holds on one or more measurement devices, or one or more cleaning device, or a combination thereof.

The support structure MT is movably mounted to the frame MF via a first positioning device PM. The first positioning device PM may be used to move the patterning device MA, and to accurately position it, relative to the frame MF (and the projection system PL which is connected to the frame MF).

The tables WT1, WT2 are movably mounted to the frame MF via first and second positioning devices PW1, PW2 respectively. The first and second positioning devices PW1, PW2 may be used to move tables WT1, WT2 respectively, and to accurately position the tables WT1, WT2 (e.g., position substrate W1 and/or substrate W2), relative to the frame MF (and the projection system PL, alignment system AS and topography measurement system TMS which are connected to the frame MF). The support structure MT and the tables WT1, WT2 may be referred to collectively as object tables. The first and second positioning devices PW1, PW2 may each be considered to be a scanning mechanism operable to move a table WT1, WT2 along a scanning path relative to a radiation beam such that the radiation beam scans across a table WT1, WT2 (e.g., a substrate W1, W2 held on a table). As noted above, in an embodiment, one of the tables WT1, WT2 may not hold a substrate and may instead be used for, e.g., measurement, cleaning, etc. in parallel with, e.g., exposure or unloading of the substrate on the other table WT1, WT2.

The lithographic apparatus shown in FIG. 1A is therefore of a type having two tables WT1, WT2, which may be referred to as a dual stage apparatus. In such "multiple stage" machines the two tables WT1, WT2 are used in parallel, with preparatory steps being carried out on one of the tables while the other table is being used for exposure.

In FIG. 1A, the table WT1 is disposed on the left and the table WT2 is disposed on the right. In this configuration, table WT1 can be used to carry out various preparatory steps in relation to the substrate W1 held thereby using alignment system AS and topography measurement system TMS (as will be described more below) prior to exposure of that substrate W1. Simultaneously, the table WT2 can be used for exposure of another substrate W2 held by table WT2. Once the substrate W2 held by table WT2 has been exposed and the preparatory steps in relation to the substrate W1 held by table WT1 have been carried out, the two tables WT1, WT2 swap places. Subsequently, the substrate W1 held by table WT1 is exposed to radiation and the substrate W2 held by table WT2 that has previously been exposed to radiation is replaced with a new substrate and various preparatory steps are performed in relation to the new substrate. Therefore, in this embodiment, each of the two tables WT1, WT2 can be disposed either on the left or the right of FIG. 1A.

In a different embodiment, the table WT1 may be a table that is not configured to hold a substrate. Optionally, a measurement in association with table WT1 may be made at the left-hand side. The table WT1 may then be moved to a position underneath projection system PL while table WT2 is moved away from underneath projection system PL (e.g., to the side opposite table WT1). Table WT1 may then be used to take actions at the projection system PL (e.g., measurement, cleaning, etc.). In the meantime, a substrate may be removed from table WT2 and then table WT2 is moved back to underneath the projection system PL while table WT1 is moved away (e.g., toward the left-hand side).

Figure 1B:
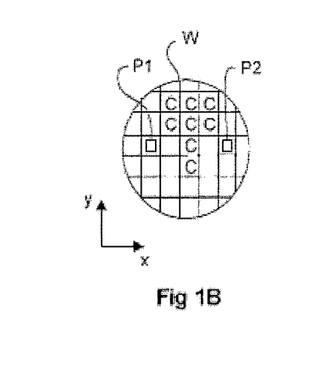
FIG. 1B shows a plan view of a substrate W of FIG. 1A.
Figure 1C:
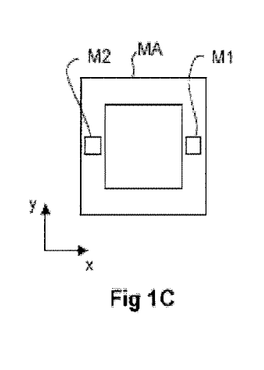
FIG. 1C shows a plan view of a patterning device, which may be used by the lithographic apparatus of FIG. 1A.

FIG. 1B shows a plan view of a substrate W which may represent either of the two substrates W1, W2 of FIG. 1A. In the following, unless otherwise stated, substrates on the left and right of the lithographic apparatus, if any, will be referred to as substrate W. FIG. 1C shows a plan view of the patterning device MA, which is provided with patterning device alignment marks (schematically depicted as boxes M1, M2).

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The illuminator IL may be referred to as a radiation system. Alternatively, the source SO and the illuminator IL, together with the beam delivery system BD if required, may be collectively referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may also be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AM configured to adjust the intensity distribution of the beam. Generally, at least the outer and/or inner radial extent (commonly referred to as σ-outer and σ-inner, respectively) of the intensity distribution in a pupil plane of the illuminator can be adjusted. The illuminator IL may also be operable to vary the angular distribution of the beam in a pupil plane of the illuminator. For example, the illuminator IL may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution, as is known in the art. A desired illumination mode may be obtained by inserting an optic which provides that illumination mode into the illuminator IL.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator IL may be arranged to linearly polarize the radiation beam. The polarization direction of the radiation beam may vary across a pupil plane of the illuminator IL, i.e. the polarization direction of radiation may be different in different regions in the pupil plane of the illuminator IL. The polarization state of the radiation may be chosen in dependence on the illumination mode.

In addition, the illuminator IL generally comprises various other components, such as an integrator IN and a condenser CO. The illuminator IL provides a conditioned beam of radiation PB, having a desired uniformity and intensity distribution in its cross section.

The shape and (spatial) intensity distribution of the conditioned beam of radiation PB are defined by optics of the illuminator IL. In a scan mode, the conditioned radiation beam PB may be such that it forms a generally rectangular band of radiation on the patterning device MA. The band of radiation may be referred to as an exposure slit (or slit). The slit may have a longer dimension (which may be referred to as its length) and a shorter dimension (which may be referred to as its width). The width of the slit may correspond to a scanning direction (y direction in FIG. 1) and the length of the slit may correspond to a non-scanning direction (x direction in FIG. 1). In a scan mode, the length of the slit limits the extent in the non-scanning direction of the target portion C that can be exposed in a single dynamic exposure. In contrast, the extent in the scanning direction of the target portion C that can be exposed in a single dynamic exposure is determined by the length of the scanning motion.

The terms "slit", "exposure slit" or "band of radiation" may be used interchangeably to refer to the band of radiation that is produced by the illuminator IL in a plane perpendicular to an optical axis of the lithographic apparatus. This plane may be at, or close to, either the patterning device MA or the substrate W. The terms "slit profile", "profile of the radiation beam", "intensity profile" and "profile" may be used interchangeably to refer to the shape of the (spatial) intensity distribution of the slit, especially in the scanning direction.

In an embodiment, the illuminator IL comprises two masking blades (shown schematically in FIG. 1A as B). Each of the two masking blades is generally parallel to the length of the slit, the two masking blades being disposed on opposite sides of the slit. Each masking blade is independently movable between a retracted position wherein it is not disposed in the path of the radiation beam PB and an inserted position wherein it blocks the radiation beam PB. The masking blades are disposed in a field plane of the illuminator IL. Therefore, by moving the masking blades into the path of the radiation beam, the profile of the radiation beam PB can be sharply truncated thus limiting the extent of the field of radiation beam PB in the scanning direction. The masking blades can be used to control which parts of an exposure region receive radiation.

The patterning device MA is also disposed in a field plane of the lithographic apparatus. In one embodiment, the masking blades may be disposed adjacent to the patterning device MA such that both the masking blades and the patterning device MA lie in substantially the same plane. Alternatively, the masking blades may be separated from the patterning device MA such that they each lie in a different field plane of the lithographic apparatus and suitable focusing optics (not shown) may be provided between the masking blades and the patterning device MA.

The illuminator IL comprises an intensity adjuster IA (shown schematically in FIG. 1A). The intensity adjuster IA is operable to attenuate the radiation beam on opposing sides of the radiation beam, as now described. The intensity adjuster IA comprises a plurality of movable fingers arranged in pairs, each pair comprising one finger on each side of the slit (i.e. each pair of fingers is separated in the y-direction). The pairs of fingers are arranged along the length of the slit (i.e. extending in the x-direction). Each movable finger is independently movable in the scanning direction (y-direction). That is, the fingers are moveable in a direction perpendicular to the length of the slit. In use, each movable finger is independently movable in the scanning direction. For example, each movable finger may be movable between at least a retracted position wherein it is not disposed in the path of the radiation beam and an inserted position wherein it partially blocks the radiation beam. By moving the fingers, the shape and/or the intensity distribution of the slit can be adjusted.

The field may be in the penumbra of the fingers such that the fingers do not sharply cut off the radiation beam PB. The pairs of fingers may be used to apply a different level of attenuation of the radiation beam PB along the length of the slit. The fingers may, for example, be used to ensure that the integral of the intensity profile of the radiation beam PB across the width of the slit is substantially constant along the length of the slit.

The radiation beam PB exiting the illuminator IL is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW2 and position sensor IF (e.g. an interferometric device), the table WT2 can be moved accurately relative to the frame MF, e.g. so as to position different target portions C in the path of the beam PB. Similarly, the first positioning device PM and another position sensor (which is not explicitly depicted in FIG. 1A) can be used to accurately position the patterning device MA with respect to the frame MF, e.g. after mechanical retrieval from a mask library, or during a scan. In general, movement of the object tables MT and WT1, WT2 will be realized with the aid of a long-stroke module (coarse positioning) and a short-stroke module (fine positioning), which form part of the positioning devices PM, PW1 and PW2. Patterning device MA and substrate W may be aligned using patterning device alignment marks M1, M2 and substrate alignment marks P1, P2.

The projection system PL may apply a reduction factor to the radiation beam PB, forming an image with features that are smaller than corresponding features on the patterning device MA. For example, a reduction factor of 4 may be applied.

In the scan mode, the first positioning device PM is operable to move the support structure MT, relative to the beam of radiation PB that has been conditioned by the illuminator IL, along a scanning path. In an embodiment, the support structure MT is moved linearly in a scanning direction at a constant scan velocity $v_{MT}$. As described above, the slit is orientated such that its width extends in the scanning direction (which coincides with the y-direction of FIG. 1). At any instance each point on the patterning device MA that is illuminated by the slit will be imaged by the projection system PL onto a single conjugate point in the plane of the substrate W. As the support structure MT moves in the scanning direction, the pattern on the patterning device MA moves across the width of the slit with the same velocity as the support structure MT. In particular, each point on the patterning device MA moves across the width of the slit in the scanning direction at velocity $v_{MT}$. As a result of the motion of this support structure MT, the conjugate point in the plane of the substrate W corresponding to each point on the patterning device MA will move relative to the slit in the plane of the table WT2.

In order to form an image of the patterning device MA on the substrate W, the table WT2 is moved such that the conjugate point in the plane of the substrate W of each point on the patterning device MA remains stationary with respect to the substrate W. The velocity (both magnitude and direction) of the table WT2 relative to the projection system PL is determined by the demagnification and image reversal characteristics of the projection system PL (in the scanning direction). In particular, if the characteristics of the projection system PL are such that the image of the patterning device MA that is formed in the plane of the substrate W is inverted in the scanning direction then the table WT2 should be moved in the opposite direction to the support structure MT. That is, the motion of the table WT2 should be anti-parallel to the motion of the support structure MT. Further, if the projection system PL applies a reduction factor a to the radiation beam PB then the distance travelled by each conjugate point in a given time period will be less than that travelled by the corresponding point on the patterning device by a factor of α. Therefore the magnitude of the velocity $|v_{WT}|$ the table WT2 should be $|v_{MT}|/\alpha$.

During exposure of a target portion C, the masking blades of the illuminator IL can be used to control the width of the slit of radiation beam PB, which in turn limits the extent of the exposure regions in the planes of the patterning device MA and the substrate W respectively. That is the masking blades of the illuminator serve as a field stop for the lithographic apparatus.

Using the scan mode, the lithographic apparatus is operable to expose a target portion C of the substrate W with substantially fixed area to radiation. For example, the target portion C may comprise part of, one or several dies.

A single substrate may be exposed to radiation in a plurality of steps, each step involving the exposure of a target portion C followed by a movement of the substrate W. After exposure of a first target portion C, the lithographic apparatus may be operable to move the substrate W relative to the projection system PL so that another target portion C can be exposed to radiation. For example, between exposures of two different target portions C on the substrate W, the table WT2 may be operable to move the substrate W so as to position the next target portion so that it is ready to be scanned through the exposure region.

The depicted apparatus can be used in another mode, wherein the support structure MT is kept essentially stationary holding a programmable patterning device, and the table WT2 is moved or scanned while a pattern imparted to the beam PB is projected onto a target portion C. In this mode, generally a pulsed radiation source is employed and the programmable patterning device is updated as required after each movement of the table WT2 or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
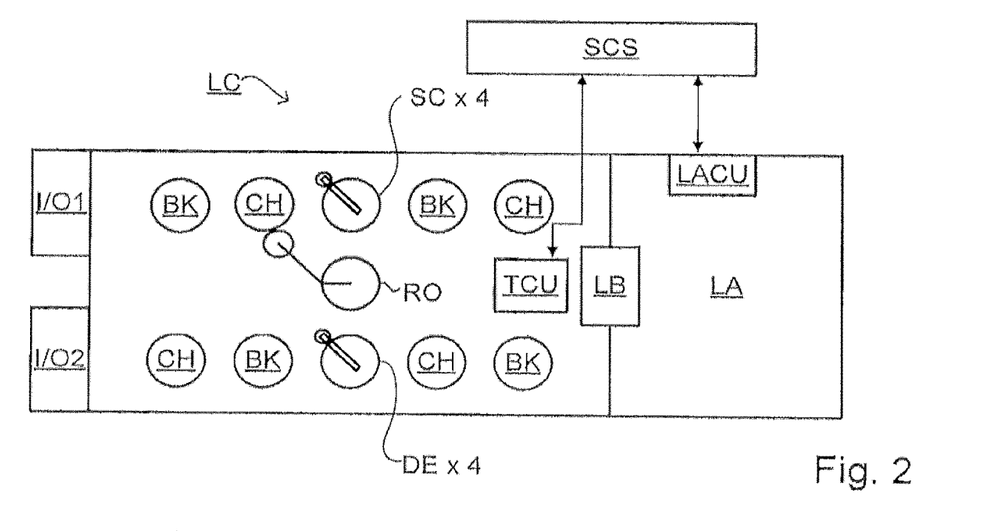
FIG. 2 schematically depicts an embodiment of a lithographic cell or cluster.

As shown in FIG. 2, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect a substrate to measure one or more properties such as alignment, overlay error between subsequent layers, line thickness, critical dimension (CD), etc. If an error is detected, an adjustment may be made to an exposure of the substrate (or of one or more subsequent substrates).

The description hereafter will focus on marks for use in alignment measurement and use of a mark for calibration of an alignment sensor system. But, the disclosure is not so limited and may have other applications. For example, the marks may be for use in different kinds of measurement or different kinds of calibration or testing, such as focusing/levelling, sensor diagnostics, etc.

In order to control the lithographic process to place device features accurately on the substrate, alignment marks are generally provided on the substrate, and the lithographic apparatus includes one or more alignment sensors by which positions of marks on a substrate can be measured accurately. These alignment sensors are effectively position measuring apparatuses. Different types of marks and different types of alignment sensors are known from different times and different manufacturers. A type of sensor that can be used in a lithographic apparatus is based on a self-referencing interferometer as described in U.S. Pat. No. 6,961,116, which is incorporated herein by reference herein in its entirety. Generally marks are measured separately to obtain X- and Y-positions. However, combined X- and Y-measurement can be performed using the techniques described in U.S. Patent Application Publication No. US 2009/195768, which is incorporated herein by reference in its entirety.

Figure 3:
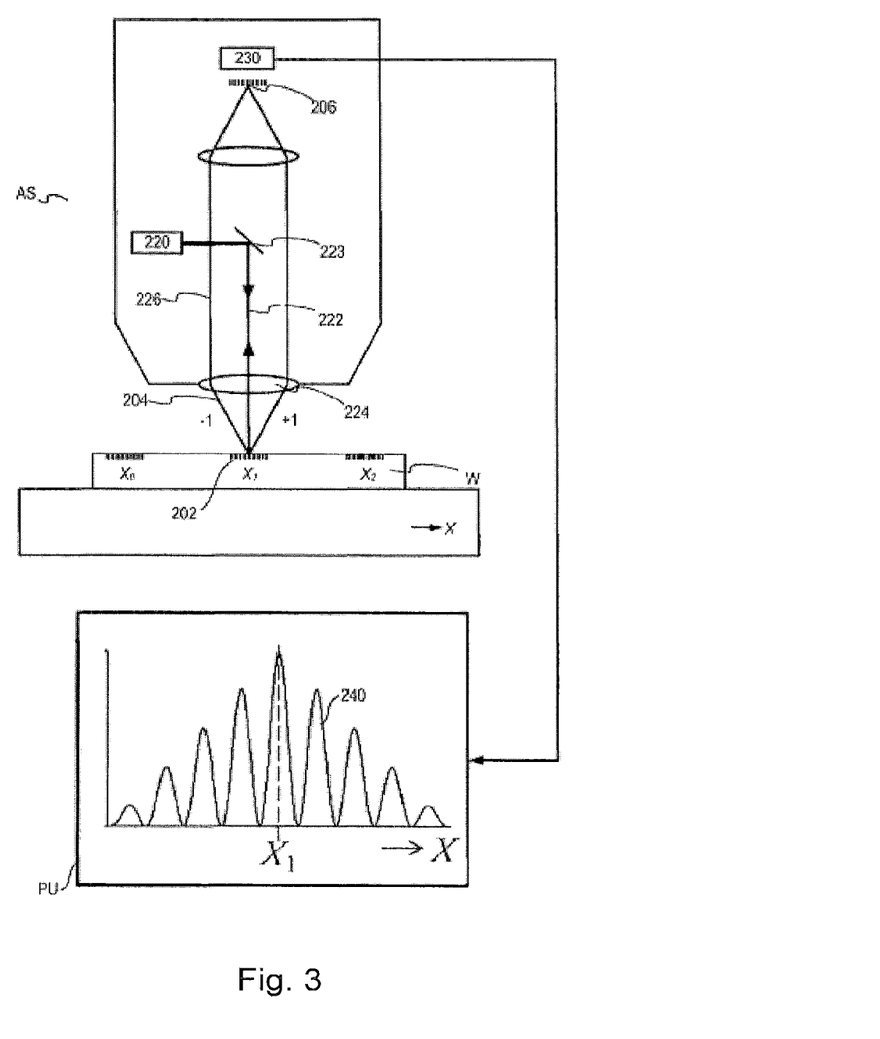
FIG. 3 schematically depicts an example alignment measurement system.

FIG. 3 is a highly schematic block diagram of an alignment sensor AS used to measure an alignment mark (e.g., measure the positions of alignment marks provided on the substrate W (schematically depicted by boxes P1, P2 in FIG. 1B)). Illumination source 220 provides a beam 222 of radiation of one or more wavelengths, which is diverted by a spot mirror 223 through an objective lens 224 onto a mark, such as mark 202, located on, e.g., substrate W. Radiation 204 scattered by mark 202 is picked up by objective lens 224 and collimated into an information-carrying beam 226. This information-carrying beam 226 is used to measure the location of the mark 202 with respect to a reference point of the sensor. This reference point can be a grating 206 or the "neutral line" in a self-referencing interferometer. Detector 230 detects the resultant signals 240. Spot mirror 223 serves conveniently as a zero order stop at this point, so that the information carrying beam 226 comprises only higher order diffracted radiation from the mark 202. This is often referred to as "dark field" measurement. In an embodiment, intensity signals 240 from individual sensors in sensor grid 230 are provided to a processing unit PU, from which values for X- and Y-position of the mark 202 are output. In an embodiment, detector 230 may be a single photodiode, and the grating 206 may have the same pitch as the image that is imaged onto it. The amount of radiation transmitted by the grating 206 varies as the alignment grating is scanned in a particular direction. Thus, the position in different directions (e.g., X and/or Y) can be determined using one or more appropriately designed marks 202 and scanning in one or more directions.

The typical alignment sensor system is made up of a complex arrangement of optics, optical assemblies, laser source modules, and detection/processing hardware and software. Accordingly, periodically, the sensor system is calibrated to maintain system performance (e.g., calibrated per substrate, calibrated per lot of substrates, etc.). So, the alignment sensor system is periodically re-calibrated to reduce or eliminate drift that occurs in the alignment sensor system.

An example of such a calibration is a mark type calibration process used to reduce or eliminate alignment offsets caused by drift in the alignment sensor system of an apparatus. As discussed above, the alignment sensor system is typically used to determine the position of the substrate, while on the substrate table, by measuring one or more alignment marks on the substrate (referred to herein as a substrate alignment mark) so that the substrate can be properly aligned with one or more other objects within the apparatus, such as the patterning device. To facilitate this, one or more marks (e.g., one or more alignment marks) provided on a structure in the apparatus (e.g., the substrate table) and that are not located on the substrate (referred to herein as an apparatus mark and in the context of a substrate table, a substrate table mark) can be measured using the alignment sensor system of the apparatus.

More specifically, an apparatus mark (e.g., a substrate table mark) is measured as part of a calibration process to help ensure that a determined alignment position of a substrate measured using a substrate alignment mark is accurately known for the purposes of positioning by the substrate table. A particular example of such calibration is an in-line shift between order (iSBO) calibration for the alignment sensor system. The in-line shift between order (iSBO) calibration involves measuring a substrate table alignment mark to analyze its diffraction orders and to evaluate any drifts thereof arising during operation of the alignment sensor system over time.

In an embodiment, the in-line shift between order (iSBO) calibration is performed each time a substrate is loaded onto the substrate table and is prepared for metrology. In an embodiment, the particular substrate table mark for the in-line shift between order (iSBO) calibration is located on a particular carrier plate permanently mounted on the substrate table. The information derived from measurement of this substrate table mark is used to calibrate the offsets in the alignment sensor system caused by normal drift.

It has been discovered that a type of substrate alignment mark used on a substrate may be sufficiently different than an apparatus mark in the apparatus measured using the alignment sensor system such that measurement of such an alignment mark of a substrate drifts differently than the measurement of the apparatus mark. For example, the substrate alignment mark and the apparatus mark can different in various ways, such as in terms of shape, a periodic structure used, size, etc. Therefore, the apparatus mark (e.g., the substrate table mark) doesn't properly mimic drift behavior for all types of substrate alignment mark. So, drift correction using such an apparatus mark can lead to incorrect measurement results when that apparatus mark is used in combination with measurements of a substrate alignment mark of a different type than the apparatus mark. For example, if a substrate table mark doesn't properly mimic the drift behavior of the substrate alignment mark on the substrate, then, for example, 1-3 nm offset in alignment could occur, with a subsequent offset in overlay of similar magnitude. This can exceed the overlay budget permitted to properly expose substrates with device patterns. Accordingly, it desirable to provide an apparatus mark that can be used in the calibration process of the alignment sensor system that can properly mimic the drift behavior of the substrate alignment mark.

Moreover, users of a lithographic apparatus can add and/or change substrate alignment mark types to, for example, facilitate alignment recipe optimization. For example, various different types of sub-segmented substrate alignment marks can be generated because they are optimized for a user's device pattern exposure process and those one or more different types of substrate alignment mark can be used on a substrate for alignment measurement. But, the apparatus mark measured using the alignment measurement system may not properly mimic the drift behavior of those one or more new substrate alignment mark types. Accordingly, it is desirable to be able to adapt to various different alignment mark types in the calibration process. That is, it is desirable to be able properly calibrate the alignment sensor system for many, if not all, of these different substrate alignment mark types and to adapt to those different substrate alignment mark types over time and relatively easily.

More generally, it desirable to provide, for example, a system that accounts for varying alignment mark forms for, e.g., calibration, diagnostics, etc.

Accordingly, there is provided a flexible and relatively quick way to allow one or more additional or new types of mark (e.g., a substrate table mark) to be provided on a structure (e.g., the substrate table) within the apparatus. By being able to add such one or more mark types, a measurement, calibration, diagnostic, etc. process can support one or more different marks in order to help maintain performance of a sensor system, such as an alignment sensor system.

Figure 4:
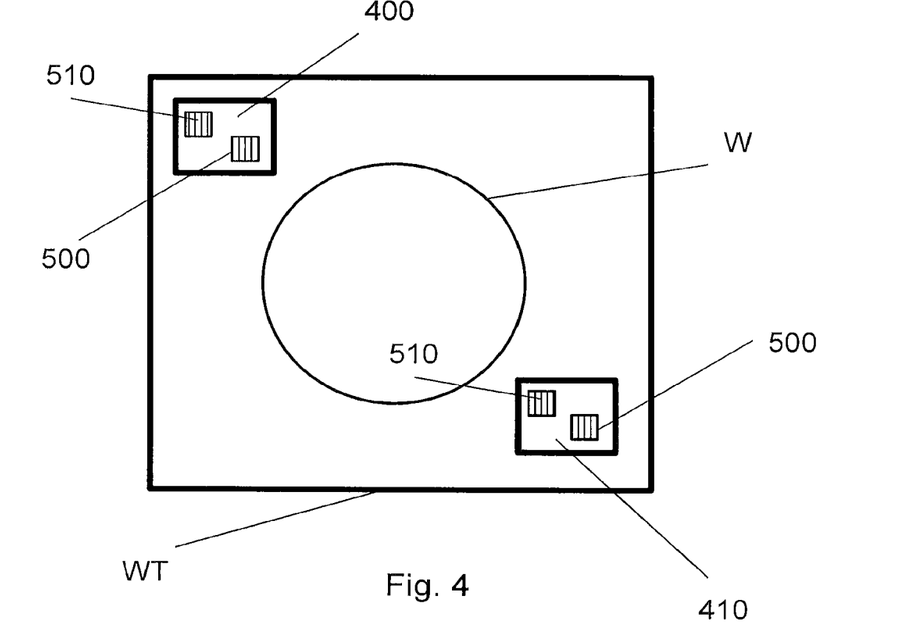
FIG. 4 schematically depicts an embodiment of an apparatus structure for an apparatus alignment mark.

Referring to FIG. 4, in an embodiment, a structure 400 is part of, or provided on, an apparatus structure (e.g., substrate table WT or other movable table) within an apparatus, such as a lithographic apparatus. In an embodiment, the structure 400 is a plate. In an embodiment, the structure 400 is a separate piece of the apparatus structure (e.g., the substrate table WT or other movable table) that can be affixed to the apparatus structure (e.g., the substrate table WT or other movable table). In an embodiment, the structure 400 is removable and thus replaceable. In an embodiment, the structure 400 is a fixed part of the apparatus structure (e.g., substrate table WT or other movable table); this can help eliminate possible drift in position between a structure 400 that is separable/removable from the apparatus structure (e.g., substrate table WT or other movable table) and the apparatus structure.

In an embodiment, the structure 400 is designed to be able to have a pattern printed therein. In an embodiment, the structure 400 comprises a coating on an upper surface thereof. In an embodiment, the coating comprises a liquid-phobic coating, such as Lipocer coating. In an embodiment, the coating comprises a photoresist. In an embodiment, the structure 400 is additional to any other structures on the apparatus structure (e.g., substrate table WT) that carry one or more marks.

Figure 5:
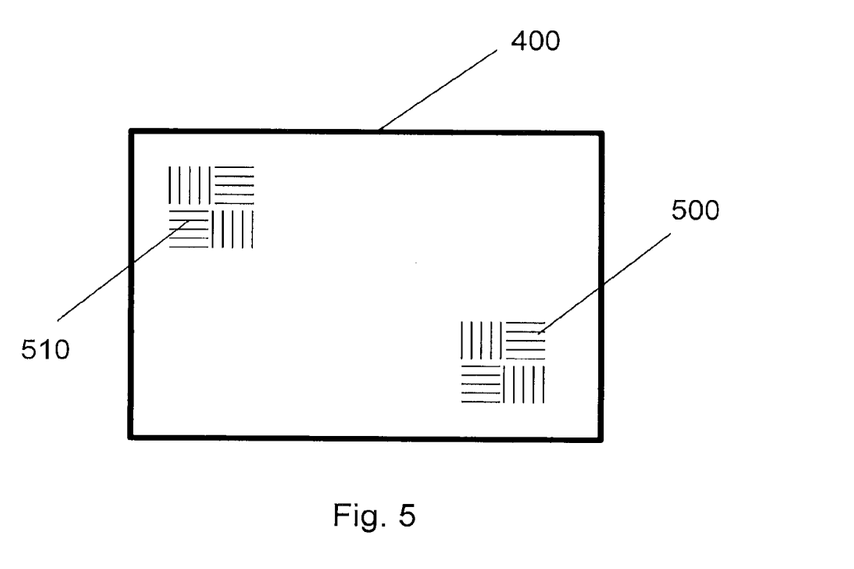
FIG. 5 schematically depicts an embodiment of in situ printing of an apparatus alignment mark within an apparatus.

In an embodiment, referring to FIG. 5, an apparatus mark 500, 510 (e.g., in the form of a substrate table mark 500, 510) is printed onto (e.g., into) the structure 400. In an embodiment, the apparatus mark 500, 510 is imaged directly onto the structure 400 in-situ in the apparatus. In an embodiment, a patterning device M of the apparatus is used to image the desired apparatus mark 500, 510 on the structure 400 using the projection system of the lithographic apparatus.

In an embodiment, a control system (e.g. of the apparatus) is provided to enable the printing of the apparatus mark 500, 510. That is, it can cause various components of the apparatus to perform a method of printing the apparatus mark 500, 510 as described herein.

In an embodiment, the apparatus mark 500, 510 comprises one or more periodic structures. In an embodiment, the apparatus mark 500, 510 comprises a first periodic structure with features extending in a first direction and a second periodic structure with features extending in a second direction transverse to the first direction (e.g., perpendicular). While apparatus mark 500, 510 is shown comprising 4 periodic structures extending in 2 different directions, the apparatus mark 500, 510 need not be so configured.

So, in an embodiment, the structure 400 is designed such that an apparatus mark 500, 510 of sufficient quality is printed directly onto the structure 400. In an embodiment, the apparatus mark 500, 510 is generated by ablation using a beam of radiation (and that desirably would not require additional processing steps after the structure 400 is ablated). In an embodiment, the apparatus mark 500, 510 is ablated into a coating (e.g., a liquidphobic coating, such as Lipocer coating) on the structure 400.

In an embodiment, the structure 400 can be blank when installed on the substrate table WT, i.e., has no existing apparatus mark 500, 510 thereon. Subsequent to installation, one or more apparatus marks 500, 510 are printed on structure 400. For example, plurality of apparatus marks can be printed such as apparatus mark 500 and apparatus mark 510. Thus, one or more different types of apparatus mark can be provided, which one or more apparatus marks match or mimic the alignment sensor system drift behavior of one or more alignment marks on a substrate.

In an embodiment, the structure 400 can having one or more apparatus marks 500, 510 prior to installation on the substrate table WT, i.e., structure 400 has an apparatus mark 500. Subsequent to installation, one or more apparatus marks 510 are printed on structure 400. In this embodiment, one or more apparatus marks can be pre-installed on the apparatus structure, such as the substrate table WT. The pre-installed one or more apparatus marks can be the same as or similar to common substrate alignment marks. Then subsequent to installation, one or more further types of apparatus mark can be printed on the structure 400.

In an embodiment, a plurality of apparatus marks is provided across the structure 400. That is, as shown in FIG. 4, the structure 400 has enough free space to enable provision of a plurality of apparatus marks across the structure 400. In an embodiment, an apparatus mark can be printed over an existing apparatus mark on structure 400. In any circumstance, the structure 400 is designed such that one more different or new apparatus mark types can be printed on structure 400 over the lifetime of the structure 400. And, thus, the structure 400 would retain the apparatus mark for the sufficient lifetime for use in alignment processes. In an embodiment, the apparatus mark is permanently printed on the structure 400. In an embodiment, a baselining process can be used to track the integrity of an apparatus mark. That is, a parameter of measurement of the apparatus mark (e.g., detectability) is tracked over time to determine whether the apparatus mark has degraded. If a threshold is crossed or met in associated with the parameter of measurement, a correction step can be taken (e.g., the apparatus mark reprinted, the apparatus mark cleaned, a measurement setting adjusted, etc.)

In an embodiment, the apparatus mark 500, 510 is of a same type as a substrate alignment mark. In an embodiment, the apparatus mark 500, 510 is not the same as a substrate alignment mark but mimics the drift behavior of the substrate alignment mark.

As discussed above, in an embodiment, the in situ printing is performed using a patterning device and the projection system of the lithographic apparatus. In additional or alternative embodiments, the in situ printing is performed using one or more other apparatuses within the lithographic apparatus. For example, an alignment measurement system, a level sensing system, or other radiation-projecting measurement apparatus can be used. In an embodiment, the system has a function (e.g. measurement) other than writing the mark on the structure 400. In an embodiment, the system is an existing system of the lithographic apparatus that is re-configured by, e.g., a software update, to perform the writing of the mark. One or more of those systems can be appropriately configured to enable printing of the mark, e.g., by providing a mask or other device in the path of the beam of such a system, by appropriate relative movement between the beam and a surface of the structure 400 to write the pattern, etc. Moreover, in an embodiment, the beam power of such a system could be increased for printing the mark on the structure 400 and/or the structure 400 can be sensitive to an existing beam of such a system. In an embodiment, a dedicated device 600, as schematically shown in FIG. 1, can be provided in the lithographic apparatus to print the mark on the structure 400. For example, the device 600 can have a radiation output (e.g., a laser) to provide radiation to a patterning device (of similar type as described herein and desirably a programmable patterning device) so as to form a patterned beam for projection on the structure 400 in order to print (e.g., by ablation) the mark. In an embodiment, the device 600 can be fixed into the lithographic apparatus (e.g., permanently installed) or be removably supplied (e.g., during a maintenance period) into the lithographic apparatus. Further, while device 600 is shown on a particular frame in FIG. 1, it can be on another part of the lithographic apparatus, including the table WT itself.

Accordingly, in embodiment, there is provided in situ printing (e.g., through imaging) of one or more apparatus marks 500, 510 (e.g., used for calibration) onto a structure 400 (e.g., a carrier plate). By in situ printing, flexibility is provided to enable use of different apparatus marks without costly and/or time consuming replacement of a substrate table. Further, by relatively quick printing of an apparatus mark, the development time and/or expense of introducing new alignment functions can be reduced.

In an additional or alternative embodiment, the structure 400 is moved to a service position at least partially out of, or adjacent to (e.g., within 1 meter) a side, of an exterior housing of the apparatus (e.g., the lithographic apparatus) by moving the apparatus structure (e.g., the substrate table WT or other movable table) having the structure 400 to at least partially out of, or adjacent to (e.g., within 1 meter) a side, of an exterior housing. In an embodiment, the structure 400 and the apparatus structure having the structure 400, are attached to the apparatus (e.g., the lithographic apparatus) at the service position. When the structure 400 is at the service position, the mark can be printed using a device 610 similar to device 600. In an embodiment, the device 610 can be attached to a holding fixture that is placed adjacent to the apparatus housing or that is attached to the apparatus. In an embodiment, the device 610 can be provided on the structure 400 or the apparatus structure having the structure 400 (e.g., sited on a substrate table WT). In an embodiment, the device 610 is movable. Once the mark is printed, the structure 400 and the apparatus structure having the structure 400 are moved back into a measurement position within the apparatus. This embodiment can be considered in-situ printing when at least part of the structure 400 and/or at least part of the apparatus structure having the structure 400 is still within the exterior housing of the apparatus when the mark is printed on the structure 400 and/or when the structure 400 and the apparatus structure having the structure 400 are still attached to the apparatus.

In an embodiment, there is provided a structure 410 that is removably attached to a structure (e.g., substrate table WT) in the apparatus. In an embodiment, the structure 410 is attached to the apparatus structure by, e.g., a suction clamp, an electrostatic clamp or other clamping apparatus, a bolt or screw, etc. In an embodiment, the structure 410 is provided with one or more apparatus marks prior to installation of structure 410 on the apparatus structure (e.g., substrate table WT). While structure 410 shows a plurality of apparatus marks 500, 510, the structure 410 can have only a single apparatus mark 500, 510.

So, by having a removable structure 410, different structures 410 with one or more different apparatus marks can be provided to enable different kinds of apparatus mark to be provided on the apparatus structure. So, in an embodiment, there can be provided a plurality of structures 410 that each has one or more different apparatus marks. In an embodiment, the structure 410 can be printed with a different apparatus mark when removed from the apparatus structure (e.g., outside of the apparatus as a whole). In an embodiment, the structure 410 is provided in addition, or as an alternative, to structure 400.

While the discussion herein has focused on alignment marks and calibration of an alignment sensor system, the disclosure herein can also be applied to different marks. For example, the marks can be used to diagnose, calibrate, etc., a different sensor system than an alignment sensor system, such as a focus/levelling system.

Embodiments have been described herein in relation to diffraction-based metrology, which, for example, measures the position of periodic structures from the intensity from the diffracted orders. However, embodiments herein may be applied, with appropriate modification where needed, to image-based metrology, which, for example, measures the position from using high-quality images of the targets. Usually these targets are periodic structures or "boxes" (Box-in-Box (BiB)).

In an embodiment, there is provided a method, comprising: printing an apparatus mark onto a structure while at least partly within an apparatus, the structure being separate from a substrate to be held by the apparatus; and measuring the apparatus mark using a sensor system within the apparatus.

In an embodiment, the structure is part of, or is located on, a substrate table configured to hold the substrate. In an embodiment, the sensor system is an alignment sensor system. In an embodiment, the method further comprises calibrating the sensor system using the apparatus mark. In an embodiment, printing the apparatus mark comprises using a beam of radiation from a system of the apparatus. In an embodiment, printing the apparatus mark comprises ablating a surface of the structure with the apparatus mark. In an embodiment, printing the apparatus mark comprises projecting a beam patterned with a pattern by a patterning device onto the structure to print the apparatus mark. In an embodiment, the structure comprises a plate with a surface coating. In an embodiment, the apparatus mark is of a same type as an alignment mark of the substrate. In an embodiment, the apparatus mark is not the same type as an alignment mark of the substrate but mimics sensor system drift behavior of the alignment mark of the substrate.

In an embodiment, there is provided an apparatus, comprising: a structure; a sensor system configured to measure a mark; and a control system configured to: cause printing of an apparatus mark onto the structure while at least partly within the apparatus, the structure being separate from a substrate to be held by the apparatus, and cause measurement of the apparatus mark using the sensor system within the apparatus.

In an embodiment, the apparatus further comprises a substrate table configured to hold the substrate and wherein the structure is part of, or is located on, the substrate table. In an embodiment, the sensor system is an alignment sensor system. In an embodiment, the control system is further configured to cause calibration of the sensor system using the apparatus mark. In an embodiment, the apparatus further comprises a radiation system configured to project a radiation beam and wherein the control system is configured to cause the printing of the apparatus mark by using a beam of radiation from the radiation system of the apparatus. In an embodiment, the control system is configured to cause the printing of the apparatus mark by ablating a surface of the structure with the apparatus mark. In an embodiment, the control system is configured to cause the printing of the apparatus mark by projecting a beam patterned with a pattern by a patterning device onto the structure to print the apparatus mark. In an embodiment, the structure comprises a plate with a surface coating. In an embodiment, the apparatus mark is of a same type as an alignment mark of the substrate. In an embodiment, the apparatus mark is not the same type as an alignment mark of the substrate but mimics sensor system drift behavior of the alignment mark of the substrate. In an embodiment, the apparatus is a lithographic apparatus configured to expose the substrate with a radiation beam.

Although specific reference may have been made above to the use of embodiments in the context of metrology and optical lithography, it will be appreciated that embodiments may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured. Embodiments may form part of a mask inspection apparatus, a metrology apparatus, or any apparatus that measures or processes an object such as a wafer (or other substrate) or mask (or other patterning device).

In an embodiment, a control system comprising hardware, software, or a combination thereof is provided (e.g., within the lithographic apparatus) to perform one or more steps of a method described herein.

Although specific reference may be made in this text to the manufacture of ICs, it should be understood that the apparatus described herein may have other applications. Possible other applications include the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams. In an embodiment, the "radiation" and "beam" for exposure may be ultraviolet (UV) radiation, extreme ultra-violet (EUV) radiation or particle beams, such as ion beams or electron beams. In an embodiment, the "radiation" and "beam" for metrology may be visible light, near-infrared radiation, or UV radiation. The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

The term "lens", where the context allows, may refer to any one or combination of various types of optical components, including refractive, reflective, magnetic, electromagnetic and electrostatic optical components. The illumination optics, optics and detection optics may encompass various types of optical components, including refractive, reflective, and catadioptric optical components for directing, shaping, or controlling the beam of radiation.

Embodiments may be implemented in hardware, firmware, software, or any combination thereof. The processor PR may be connected to a memory which stores processor readable instructions that when executed will apply apply a decoding sequence to a signal output from the detector 18 Embodiments may also be implemented as instructions stored on a computer-readable medium, which may be read and executed by one or more processors. A computer-readable medium may include any mechanism for storing or transmitting information in a form readable by a machine (e.g., a computing device). For example, a computer-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

So, while specific embodiments have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method, comprising:
   printing an apparatus mark onto a structure while at least partly within a substrate processing apparatus, the structure being separate from a substrate to be held by the apparatus, the printing involving using a patterned beam of radiation or using ablating radiation, such that the radiation directly contacts the structure when printing the apparatus mark; and
   measuring the apparatus mark using a sensor system within the apparatus.

2. The method of claim 1, wherein the structure is part of, or is located on, a substrate table configured to hold the substrate.

3. The method of claim 1, wherein the sensor system is an alignment sensor system.

4. The method of claim 1, further comprising calibrating the sensor system using the apparatus mark.

5. The method of claim 1, wherein printing the apparatus mark comprises using a beam of radiation from a system of the apparatus.

6. The method of claim 1, wherein printing the apparatus mark comprises using the ablating radiation and ablating a surface of the structure with the apparatus mark.

7. The method of claim 1, wherein printing the apparatus mark comprises using a patterned beam and projecting the patterned beam having a pattern provided by a patterning device onto the structure to print the apparatus mark.

8. The method of claim 1, wherein the structure comprises a plate with a surface coating.

9. The method of claim 1, wherein the apparatus mark is of a same type as an alignment mark of the substrate.

10. The method of claim 1, wherein the apparatus mark is not the same type as an alignment mark of the substrate but mimics sensor system drift behavior of the alignment mark of the substrate.

11. A substrate processing apparatus, comprising:
    a structure;
    a sensor system configured to measure a mark; and
    a control system configured to at least:
       cause printing of an apparatus mark onto the structure while at least partly within the apparatus, the structure being separate from a substrate to be held by the apparatus, the printing involving using a patterned beam of radiation or using ablating radiation, such that the radiation directly contacts the structure when printing the apparatus mark, and
       cause measurement of the apparatus mark using the sensor system within the apparatus.

12. The apparatus of claim 11, further comprising a substrate table configured to hold the substrate and wherein the structure is part of, or is located on, the substrate table.

13. The apparatus of claim 11, wherein the sensor system is an alignment sensor system.

14. The apparatus of claim 11, wherein the control system is further configured to cause calibration of the sensor system using the apparatus mark.

15. The apparatus of claim 11, further comprising a radiation system configured to project a radiation beam and wherein the control system is configured to cause the printing of the apparatus mark by using a beam of radiation from the radiation system of the apparatus.

16. The apparatus of claim 11, wherein the control system is configured to cause the printing of the apparatus mark by ablating a surface of the structure with the apparatus mark using the ablating radiation.

17. The apparatus of claim 11, wherein the control system is configured to cause the printing of the apparatus mark by projecting the patterned beam having a pattern provided by a patterning device onto the structure to print the apparatus mark.

18. The apparatus of claim 11, wherein the structure comprises a plate with a surface coating.

19. A non-transitory computer program product comprising machine-readable instructions therein, the machine-readable instructions, upon execution by a processor system, configured to cause the processor system to cause performance of at least:
   printing of an apparatus mark onto a structure while at least partly within a substrate processing apparatus, the structure being separate from a substrate to be held by the apparatus, the printing involving using a patterned beam of radiation or using ablating radiation, such that the radiation directly contacts the structure when printing the apparatus mark; and
   measuring of the apparatus mark using a sensor system within the apparatus.

20. The computer program product of claim 19, wherein the structure is part of, or is located on, a substrate table of a lithographic projection apparatus, the substrate table configured to hold the substrate.

* * * * *